United States Patent [19]
Yoshioka et al.

[11] Patent Number: 6,149,727
[45] Date of Patent: Nov. 21, 2000

[54] SUBSTRATE PROCESSING APPARATUS

[75] Inventors: Katsushi Yoshioka; Hiroyuki Ogura; Takuya Sanari, all of Kyoto, Japan

[73] Assignee: Dainippon Screen Mfg. Co., Ltd., Japan

[21] Appl. No.: 09/166,132

[22] Filed: Oct. 5, 1998

[30] Foreign Application Priority Data

Oct. 8, 1997 [JP] Japan .................................. 9-276209

[51] Int. Cl.⁷ .......................... B05C 13/02; B05B 13/02; B05D 7/24; B25B 11/00
[52] U.S. Cl. ............................... 118/500; 118/52; 118/56; 118/320; 118/730; 427/240; 134/902; 134/153; 269/21
[58] Field of Search ............................... 118/52, 56, 319, 118/320, 500, 501, 502, 503, 504, 505, 728, 729, 730; 134/153, 902; 427/240; 269/21; 361/234; 279/128

[56] References Cited

U.S. PATENT DOCUMENTS

| | | | |
|---|---|---|---|
| 4,603,867 | 8/1986 | Babb et al. ................................. | 279/3 |
| 4,968,375 | 11/1990 | Sato et al. ................................ | 156/345 |
| 5,572,786 | 11/1996 | Rensch ....................................... | 29/559 |
| 5,908,661 | 7/1999 | Batcheldor et al. ..................... | 427/420 |

*Primary Examiner*—Laura Edwards
*Assistant Examiner*—J. A. Lorengo
*Attorney, Agent, or Firm*—Ostrolenk, Faber, Gerb & Soffen, LLP

[57] ABSTRACT

A spin holder has a disk-like supporting portion, and a circular wall portion for supporting the back side of a substrate is formed inside the periphery of the top surface of the disk-like supporting portion. A circular groove is formed near the periphery of the top surface of the disk-like supporting portion, the circular groove surrounding the outside of the circular wall portion. An O ring is fitted into the circular groove. The top surface of the circular wall portion on the spin holder supports the back side of the substrate and the O ring comes in close contact with the back side of the substrate. Even if a vacuum leakage occurs between the circular wall portion and the back side of the substrate due to suction force created by a vacuum suction source, the O ring keeps the hermetic state in the space between the circular wall portion and the O ring. This prevents mist around the spin holder from being drawn toward the suction surface between the O ring and the substrate.

17 Claims, 13 Drawing Sheets

SUBSTRATE PROCESSING APPARATUS

BACKGROUND OF THE INVENTION

1. Field of the Invention

The present invention relates to a substrate processing apparatus for applying given processing to a substrate while rotating the substrate.

2. Description of the Background Art

Substrate processing apparatuss are used to apply various processings, such as processing for applying processing liquid like photoresist liquid, developing processing, cleaning processing, etc., to substrates such as semiconductor wafers, glass substrates for use in liquid-crystal display devices, glass substrates for photomasks, glass substrates for optical disks, etc.

For example, a spin coater applies processing liquid like photoresist onto a substrate while horizontally supporting and rotating the substrate. A spin developer supplies developer onto a substrate while horizontally supporting and rotating the substrate.

FIG. 22 is a schematic sectional view showing an example of a conventional substrate processing apparatus. The substrate processing apparatus shown in FIG. 22 is a spin coater.

In FIG. 22, the substrate processing apparatus has a spin holder (a spin chuck) 1 for holding a substrate W by vacuum suction. The spin holder 1 is attached on the top end of a rotating shaft 2 of a motor (not shown) and is rotation-driven around the vertical axis.

A splash-guarding cup 4 is provided to surround the substrate W held on the spin holder 1. This cup 4 is formed of an upper cup 4a and a lower cup 4b. The upper cup 4a is attached to the lower cup 4b in a detachable manner. The upper cup 4a has an opening 13 and the lower cup 4b has a waste fluid outlet 8 and a plurality of gas exhaust holes 7 in its lower part. The gas exhaust holes 7 are connected to a gas exhaust system in the factory.

An internal cup 6 is provided below the spin holder 1. This internal cup 6 has an inclined surface which is inclined down outwardly.

A resist nozzle 9 for discharging resist liquid onto the substrate W is provided above the spin holder 1. The resist nozzle 9 can be moved up and down and also can be moved between the position above the substrate W and a stand-by position outside the cup 4. Provided under the substrate W are a plurality of back side cleaning nozzles 11 for discharging rinse liquid for cleaning the back side of the substrate W.

When applying resist liquid, a flow of clean air is supplied from above toward the surface of the substrate W through the opening 13 of the upper cup 4a. The resist liquid is discharged from the resist nozzle 9 onto the substrate W supported on the spin holder 1, which spreads over the entire surface of the substrate W as the substrate W rotates.

At this time, surplus resist liquid is splashed away from the substrate W by centrifugal force developed as the substrate W rotates and attaches to the inner wall of the cup 4. Part of the resist liquid attached on the inner wall of the cup 4 remains attached, and the remaining part flows down along the inner surface of the cup 4 and is discharged outside through the waste fluid outlet 8.

Further, when the resist liquid strikes the inner wall of the cup 4, part of it becomes mist due to the impact. The mist floats on the rotating flow produced in the cup 4 as the substrate W rotates. The mist floating in the cup 4 comes down along the inclined surface of the internal cup 6 from around the substrate W with the clean air flow supplied from above. It is then drawn into the gas exhaust holes 7 under the bottom side of the internal cup 6 and exhausted by an external exhausting system.

After the resist liquid has been applied, rinse liquid is discharged toward the back side of the substrate W from the back side cleaning nozzles 11 to clean the back side of the substrate W.

Recently, with spin coaters, there is a tendency to increase the rotating speed of the substrate W when spreading resist liquid for the purpose of saving the resist. Also, when using special resist liquid having high viscosity with a spin coater, the substrate W is rotated at increased speed to spread the resist liquid so that the thickness of the resist film can be controlled thin.

However, as the substrate W is rotated at higher speed, the air flow in the cup 4 is disturbed more violently, or the resist liquid is splashed away to become mist at higher rate. As the result, the absolute amount of mist in the cup 4 increases.

The spin holder 1 of the conventional substrate processing apparatus is formed of synthetic resin, such as PEEK (Polyether-ether-ketone), Teflon, polyacetal, etc. Since these synthetic resins have inferior elasticity as compared with rubber, fine vacuum leakage occurs at the suction surface between the spin holder 1 and the substrate W, as shown by the arrows in FIG. 23.

Particularly, when substrates W pass through thermal treatment process, for example, the individual substrates W will be warped with different tendencies. In such a case, when the substrates W are processed in the spin coater, the leakage from the suction surface between the spin holder 1 and the substrates W will occur more seriously.

Conventionally, since a substrate W was rotated at relatively low rotating speed in the spin coater, only a small amount of mist was produced around the substrate W. Therefore only a small amount of mist was drawn by the leakage from the suction surface between the spin holder 1 and the substrate W.

However, as the rotating speed of the substrate W increases, the absolute amount of mist increases as stated above, and an increased amount of mist is then drawn by the leakage from the suction surface of the spin holder 1 and the substrate W. As a result, the drawn mist will attach to the back side of the substrate W in the vicinity of the periphery of the spin holder 1. The mist attached to the back side of the substrate W dries to form particles to contaminate the back side of the substrate W. The contaminated back side of the substrate W will cause inferior focusing in exposure processing.

Although the contamination on the back side of the substrate W can be cleaned away with the rinse liquid delivered from the back side cleaning nozzles 11, the rinse liquid cannot be delivered toward the periphery of the spin holder 1, because penetration of the rinse liquid into the spin holder 1 is not desirable. Accordingly, it is difficult to completely remove the mist attached on the back side of the substrate W in the vicinity of the periphery of the spin holder 1.

SUMMARY OF THE INVENTION

An object of the present invention is to provide a substrate processing apparatus in which contamination on the back sides of substrates by adhesion of mist is prevented or alleviated.

According to the present invention, a substrate processing apparatus for applying given processing to a substrate while rotating the substrate comprises: a spin holder comprising a first circular portion for supporting the back side of the substrate and at least one second circular portion provided to surround the outside of the first circular portion, for holding the substrate by suction in a horizontal attitude; rotation driving means for rotating the spin holder; and suction means for sucking the substrate through a space inside the first circular portion on the spin holder.

In the substrate processing apparatus of the present invention, the first circular portion on the spin holder supports the back side of the substrate and the suction means brings the space inside the first circular portion into a vacuum state or a negative-pressure state with respect to atmospheric pressure. The substrate is thus held by suction on the first circular portion. The spin holder is rotatively driven by the rotation driving means in this state.

Since at least one second circular portion is provided on the spin holder to surround the outside of the first circular portion, the second circular portion keeps the hermetic state in the space between the first and second circular portions even if a vacuum leakage occurs between the first circular portion and the back side of the substrate due to suction force from the suction means. This prevents mist in the space around the spin holder from being drawn to the suction surface between the spin holder and the substrate.

Accordingly it is possible to prevent adhesion of mist to the back side of the substrate in the vicinity of the periphery of the spin holder, or to reduce the amount of adhering mist. This prevents or alleviates contamination to the back side of the substrate.

The second circular portion may be a circular seal member provided on a top surface of the spin holder to come in close contact with the back side of the substrate.

In this case, the top surface of the first circular portion supports the back side of the substrate and the circular seal member comes in close contact with the back side of the substrate. Even if a vacuum leakage occurs between the first circular portion and the back side of the substrate due to suction force from the suction means, the circular seal member keeps the hermetic state in the space between the first circular portion and the circular seal member. This prevents mist in the space around the spin holder from being drawn to the suction surface between the spin holder and the substrate.

The second circular portion may be a circular elastic member provided on a periphery of the spin holder to come in close contact with the back side of the substrate while spreading outward.

In this case, the top surface of the first circular portion supports the back side of the substrate and the circular elastic member comes in close contact with the back side of the substrate while spreading outward. Even if a vacuum leakage occurs between the first circular portion and the back side of the substrate due to suction force from the suction means, the circular elastic member keeps the hermetic state in the space between the first circular portion and the circular elastic member. This prevents mist in the space around the spin holder from being drawn to the suction surface between the spin holder and the substrate.

The second circular portion may be a circular wall portion provided on the outside of the first circular portion on a top surface of the spin holder.

In this case, the top surface of the first circular portion and the top surface of the circular wall portion support the back side of the substrate. Even if a vacuum leakage occurs between the first circular portion and the back side of the substrate due to suction force from the suction means, the circular wall portion keeps the hermetic state in the space between the first circular portion and the circular wall portion. This prevents mist in the space around the spin holder from being drawn to the suction surface between the spin holder and the substrate.

One or a plurality of connection holes may be formed in the spin holder to connect a space between the first circular portion and the second circular portion to a space outside the spin holder.

In this case, when a vacuum leakage occurs between the first circular portion on the spin holder and the back side of the substrate due to suction force from the suction means, air flows occur from outside of the spin holder toward the space between the first circular portion and the second circular portion through the one or plurality of connection holes. That is to say, air flow directed from around the spin holder toward the suction surface between the spin holder and the substrate is converted into air flow directed from around the spin holder into the connection holes. This prevents mist in the space around the spin holder from being drawn to the suction surface between the spin holder and the substrate.

The one or plurality of connection holes may extend from an under surface of the spin holder to a top surface of the spin holder.

In this case, since the connection holes extend from the under surface of the spin holder to the top surface of the spin holder, air flow occurs from the under side of the spin holder to the space between the first circular portion and the second circular portion through the connection holes. This prevents mist in the space around the spin holder from being drawn to the suction surface between the spin holder and the substrate.

Since a smaller amount of mist exists in the space under the spin holder than in the space around the spin holder, the connection holes guide relatively clean air to the back side of the substrate. Hence almost no mist attaches to the back side of the substrate through the air flow guided to the space between the first circular portion and the second circular portion through the connection holes. This prevents or alleviates contamination on the back side of the substrate by adhesion of mist.

The one or plurality of connection holes may be inclined in a circumferential direction so that an air flow is generated from the under surface of the spin holder to the top surface of the spin holder as the spin holder rotates.

In this case, air flow occurs from under the spin holder to the top surface of the spin holder through the connection holes inclined in the circumferential direction as the spin holder rotates. This creates positive pressure with respect to atmospheric pressure in the space between the first circular portion and the second circular portion on the spin holder. Accordingly, even if a vacuum leakage occurs between the first circular portion and the back side of the substrate due to suction force from the suction means, it is possible to sufficiently prevent mist from being drawn to the suction surface between the spin holder and the substrate.

Since a smaller amount of mist exists in the space under the spin holder than in the space around the spin holder, the connection holes guide relatively clean air to the back side of the substrate. Hence almost no mist attaches to the back side of the substrate through the air flow guided to the space between the first circular portion and the second circular portion through the connection holes. This prevents or alleviates contamination on the back side of the substrate due to adhesion of mist.

One or a plurality of blades may be provided on the under surface of the spin holder to guide an air flow into the one or plurality of connection holes as the spin holder rotates.

In this case, the one or plurality of blades provided on the under surface of the spin holder creates flow of air from the under side of the spin holder to the top side of the spin holder through the connection holes as the spin holder rotates. This creates positive pressure with respect to atmospheric pressure in the space between the first circular portion and the second circular portion on the spin holder. Accordingly, even if the suction force created by the suction means causes a vacuum leakage between the first circular portion and the back side of the substrate, it is possible to sufficiently prevent mist from being drawn to the suction surface between the spin holder and the substrate.

Since a smaller amount of mist exists in the space under the spin holder than in the space around the spin holder, the connection holes guide relatively clean air to the back side of the substrate. Hence the air flow guided to the space between the first circular portion and the second circular portion through the connection holes will cause almost no mist to attach to the back side of the substrate. This prevents or alleviates contamination on the back side of the substrate by adhesion of mist.

The spin holder may have a shielding portion extending downward from the bottom end of a periphery of the spin holder, and covering the lower openings of the one or plurality of connection holes at an interval.

In this case, the shielding portion prevents air flow guided from around the spin holder into the connection holes, so that relatively clean air near the center under the spin holder is guided into the connection holes. Hence almost no mist attaches to the back side of the substrate due to the air flow guided into the space between the first circular portion and the second circular portion through the connection holes. Contamination on the back side of the substrate due to adhesion of mist is thus prevented or alleviated.

A gap may be formed between the second circular portion and the back side of the substrate.

In this case, the positive-pressure effect in the space between the first circular portion and the second circular portion causes air flow directed from the space between the first circular portion and the second circular portion to the outside of the spin holder. Accordingly, even if a vacuum leakage occurs between the first circular portion and the back side of the substrate due to suction force from the suction means, it is possible to sufficiently prevent mist from being drawn to the suction surface between the spin holder and the substrate.

The one or plurality of connection holes may extend from a peripheral surface of the spin holder and bend to a top surface of the spin holder.

In this case, the connection holes extending from the peripheral surface of the spin holder and bending to the top surface of the spin holder develop air flow directed from the peripheral surface of the spin holder to the space between the first circular portion and the second circular portion through the connection holes. This prevents mist in the space around the spin holder from being drawn to the suction surface between the spin holder and the substrate.

At this time, mist guided into the connection holes from the peripheral surface of the spin holder sticks to the inner wall surface of the connection holes in the bending parts. Accordingly almost no mist sticks to the back side of the substrate due to the air flow guided into the space between the first circular portion and the second circular portion through the connection holes. Contamination on the back side of the substrate due to adhesion of mist is thus prevented or alleviated.

The second circular portion may be a circular elastic portion which comes in close contact with the back side of the substrate while curving outward.

In this case, the top surface of the first circular portion supports the back side of the substrate and the circular elastic portion comes in close contact with the back side of the substrate while curving outward. Even if a vacuum leakage occurs between the first circular portion and the back side of the substrate due to suction force from the suction means, the circular elastic portion keeps the hermetic state in the space between the first circular portion and the circular elastic portion. This prevents mist in the space around the spin holder from being drawn to the suction surface between the spin holder and the substrate.

The first circular portion may be a circular elastic portion which comes in close contact with the back side of the substrate while curving inward.

In this case, the circular elastic portion coming in close contact with the back side of the substrate while curving inward prevents a vacuum leakage between the circular elastic portion and the back side of the substrate due to suction force created by the suction means.

Further, since at least one second circular portion is provided on the spin holder to surround the outside of the circular elastic portion, the second circular portion keeps the hermitic state in the space between the circular elastic portion and the second circular portion even if a vacuum leakage occurs between the circular elastic portion and the back side of the substrate due to suction force from the suction means. This prevents mist in the space around the spin holder from being drawn to the suction surface between the spin holder and the substrate.

According to another aspect of the present invention, a substrate processing apparatus for applying given processing to a substrate while rotating the substrate comprises: a spin holder comprising a circular elastic portion which comes in close contact with the back side of the substrate while curving outward, for holding the substrate by suction in a horizontal attitude; rotation driving means for rotating the spin holder; and suction means for sucking the substrate through a space inside the circular elastic portion on the spin holder.

According to the substrate processing apparatus of the present invention, the circular elastic portion on the spin holder comes in contact with the back side of the substrate while curving outward to support the substrate in a horizontal attitude and the suction means brings the space inside the circular elastic portion into a vacuum state or a negative-pressure state with respect to atmospheric pressure. The substrate is thus held on the circular elastic portion by suction. In this state, the spin holder is rotation-driven by the rotation driving means.

The circular elastic portion coming in close contact with the back side of the substrate while curving outward keeps the space inside the circular elastic portion hermetically sealed. This prevents mist in the space around the spin holder from being drawn to the suction surface between the spin holder and the substrate.

Accordingly it is possible to prevent adhesion of mist to the back side of the substrate in the vicinity of the periphery of the spin holder or to reduce the amount of mist attached. This prevents or alleviates contamination on the back side of the substrate.

DESCRIPTION OF THE PREFERRED EMBODIMENTS

Figure 1:
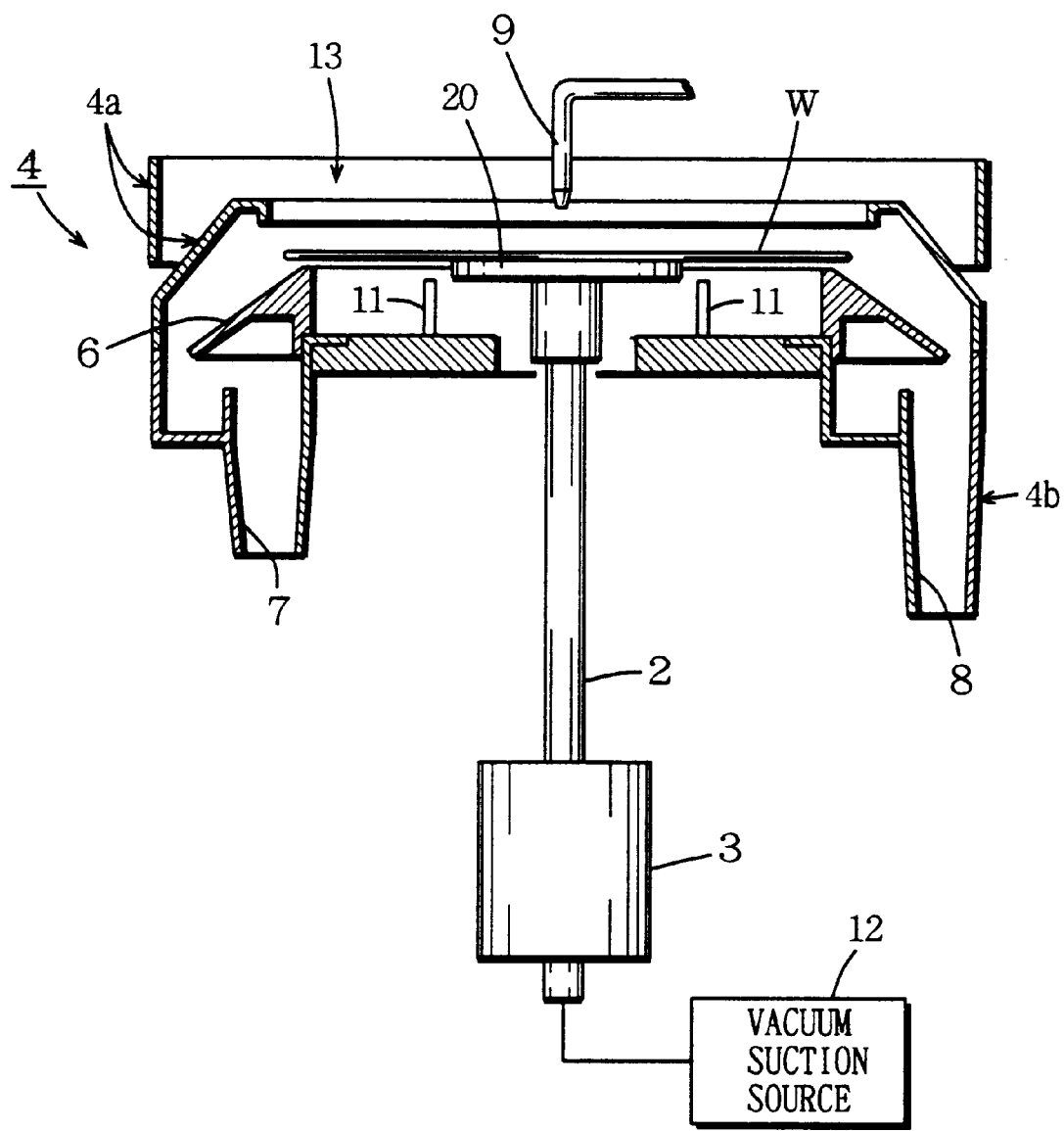
FIG. 1 is a schematic section showing a substrate processing apparatus according to a first embodiment of the present invention.

FIG. 1 is a schematic sectional view showing a substrate processing apparatus according to a first embodiment of the present invention. In this embodiment, a spin coater will be explained as an example of a substrate processing apparatus.

In FIG. 1, the substrate processing apparatus has a vacuum-suction type spin holder (spin chuck) 20 for holding a substrate W by suction in a horizontal attitude. The spin holder 20 is attached on the top end of a rotating shaft 2 of a motor 3 and is rotation-driven around the vertical axis. The rotating shaft 2 of the motor 3 has a hollow structure, whose lower end is coupled to a vacuum suction source 12, such as a vacuum pump.

The vacuum suction source 12 sucks the substrate W on the spin holder 20 through a space inside the rotating shaft 2. The substrate W is thus held by suction on the spin holder 20. The structure of the spin holder 20 will be described later.

A splash-guarding cup 4 is provided to surround the substrate W held on the spin holder 20. This cup 4 is formed of an upper cup 4a and a lower cup 4b. The upper cup 4a is attached to the lower cup 4b in a detachable manner. The upper cup 4a has an opening 13 and the lower cup 4b has a waste fluid outlet 8 and a plurality of gas exhaust holes 7 in its lower part. The gas exhaust holes 7 are connected to a gas exhaust system in the factory.

An internal cup 6 is provided below the spin holder 20. This internal cup 6 has an inclined surface which is inclined down outwardly.

A resist nozzle 9 for discharging resist liquid onto the substrate W is provided above the spin holder 20. The resist nozzle 9 can be moved up and down and also can be moved between the position above the substrate W and a stand-by position outside the cup 4. Provided under the substrate W are a plurality of back side cleaning nozzles 11 for discharging rinse liquid for cleaning the back side of the substrate W.

When applying resist liquid, a flow of clean air is supplied from above toward the surface of the substrate W through the opening 13 of the upper cup 4a. The resist liquid is discharged from the resist nozzle 9 onto the substrate W supported on the spin holder 20, which spreads over the entire surface of the substrate W as the substrate W rotates.

Figure 2:
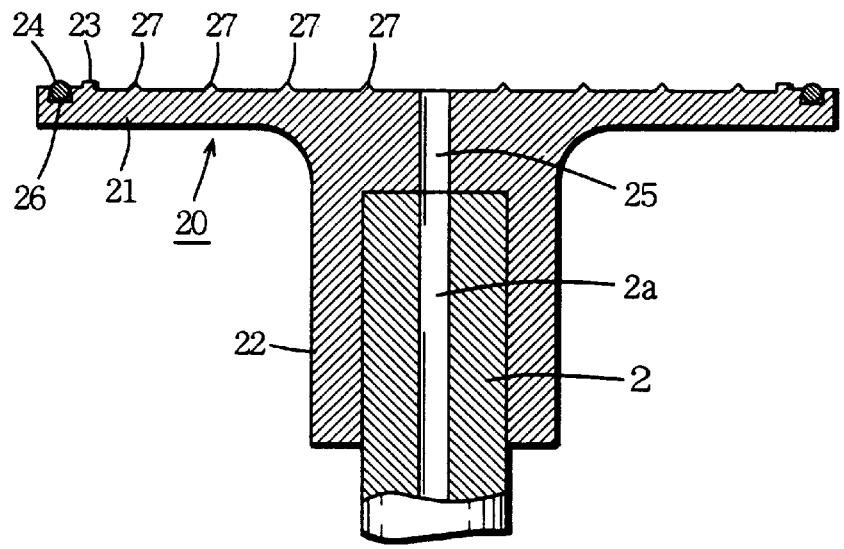
FIG. 2 is a sectional view showing the spin holder of the substrate processing apparatus shown in FIG. 1.
Figure 3:
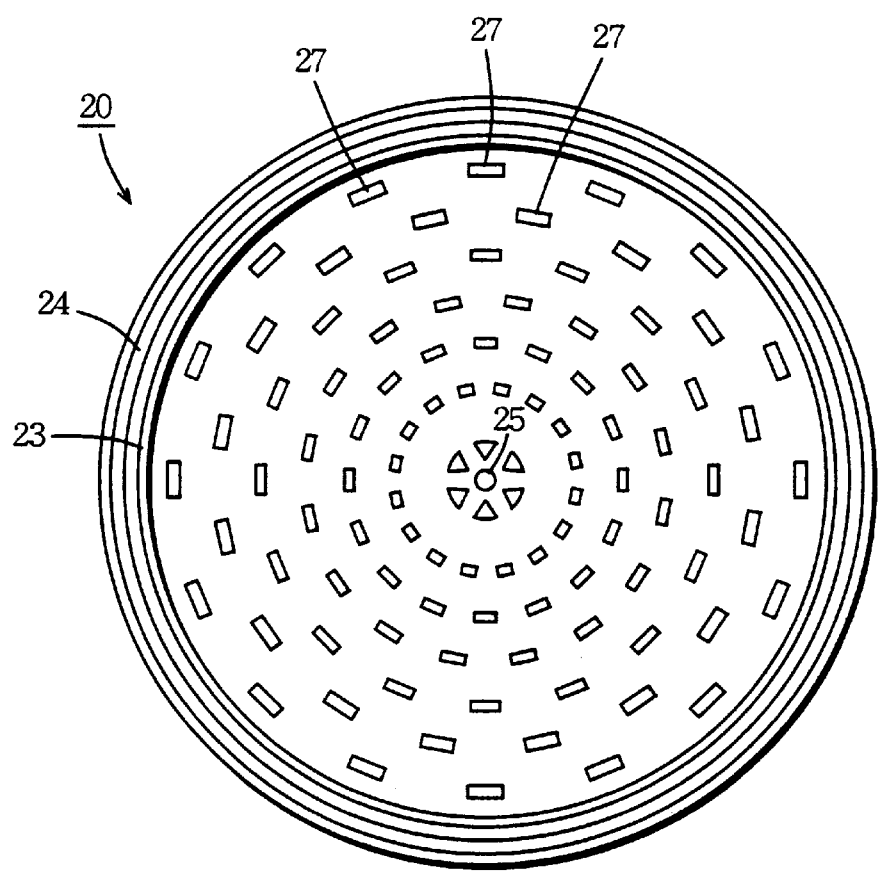
FIG. 3 is the plane view of the spin holder of the substrate processing apparatus shown in FIG. 1.

FIG. 2 is a sectional view of the spin holder 20 of the substrate processing apparatus shown in FIG. 1, and FIG. 3 is a plane view showing the spin holder 20 of the substrate processing apparatus shown in FIG. 1.

The spin holder 20 is formed of synthetic resin such as PEEK (Poly-ether-ether-ketone), Teflon, polyacetal, etc., which has a disk-like supporting portion 21 and a tubular fitting portion 22. The rotating shaft 2 of the motor 3 is fitted into the tubular fitting portion 22. The spin holder 20 has a connection passage 25 formed in the center, which opens in the top surface. This connection passage 25 communicates with a passage 2a in the rotating shaft 2 of the motor 3.

A circular wall portion 23 for supporting the back side of the substrate W is formed inside the periphery of the top surface of the disk-like supporting portion 21. Further, a circular groove 26 is formed in the vicinity of the periphery of the top surface of the disk-like supporting portion 21 to surround the outside of the circular wall portion 23. An O ring 24 is fitted in the circular groove 26. A plurality of projections 27 are formed in the region inside the circular wall portion 23 on the top surface of the disk-like supporting portion 21. These plurality of projections 27 support the back side of the substrate W.

In this embodiment, the motor 3 corresponds to rotation-driving means and the vacuum suction source 12 corresponds to suction means. The circular wall portion 23 corresponds to a first circular portion, and the O ring 24 corresponds to a second circular portion.

Figure 4:
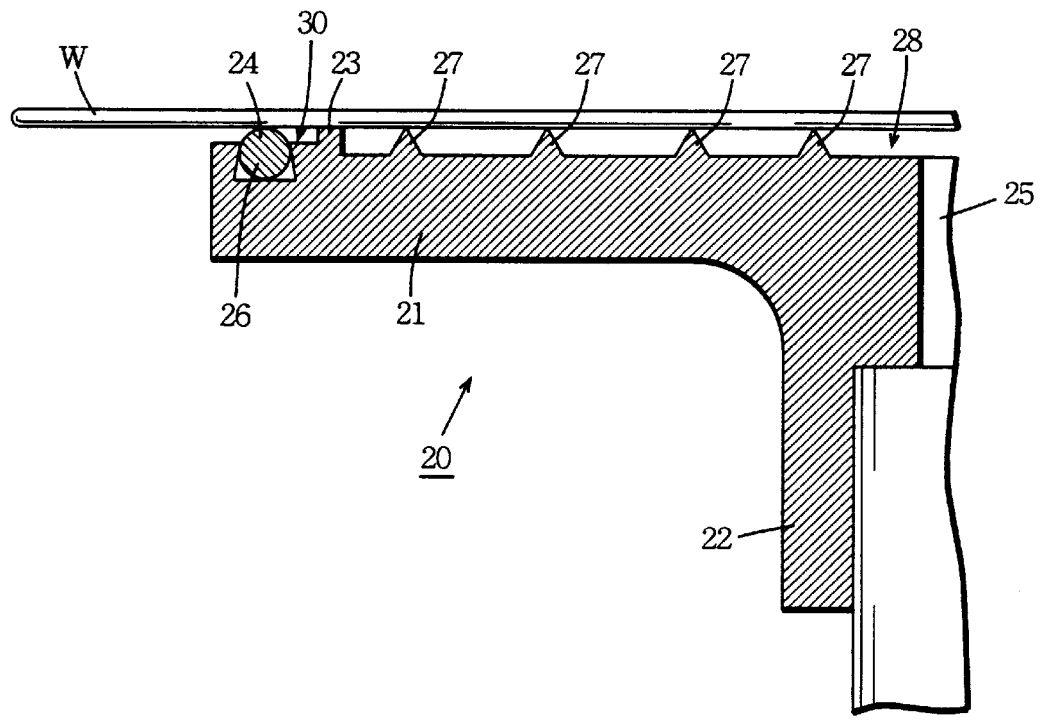
FIG. 4 is a sectional view showing part of the spin holder shown in FIG. 2.

FIG. 4 is a sectional view showing part of the spin holder 20 shown in FIG. 2 and FIG. 3. As shown in FIG. 4, the top surface of the circular wall portion 23 supports the back side of the substrate W, and the O ring 24 comes in close contact with the back side of the substrate W. The vacuum suction source 12 in FIG. 1 evacuates the air in the space 28 surrounded by the circular wall portion 23, the disk-like supporting portion 21 and the substrate W through the passage 2a in the rotating shaft 2 of the motor 3 and the connection passage 25 in the spin holder 20. This brings the space 28 into a vacuum state, and the substrate W is thus held by suction on the circular wall portion 23.

In this case, the O ring 24 surrounding the outside of the circular wall portion 23 is in close contact with the back side of the substrate W. Accordingly, even if a vacuum leakage occurs between the circular wall portion 23 and the back side of the substrate W due to the suction force created by the vacuum suction source 12, the O ring 24 keeps the hermetic state in the space 30 between the circular wall portion 23 and the O ring 24. This prevents mist around the spin holder 20 from being drawn to the suction surface between the O ring 24 and the substrate W. As the result, it is possible to prevent adhesion of mist to the back side of the substrate W in the vicinity of the periphery of the spin holder 20, or to reduce the amount of mist attached.

Figure 5:
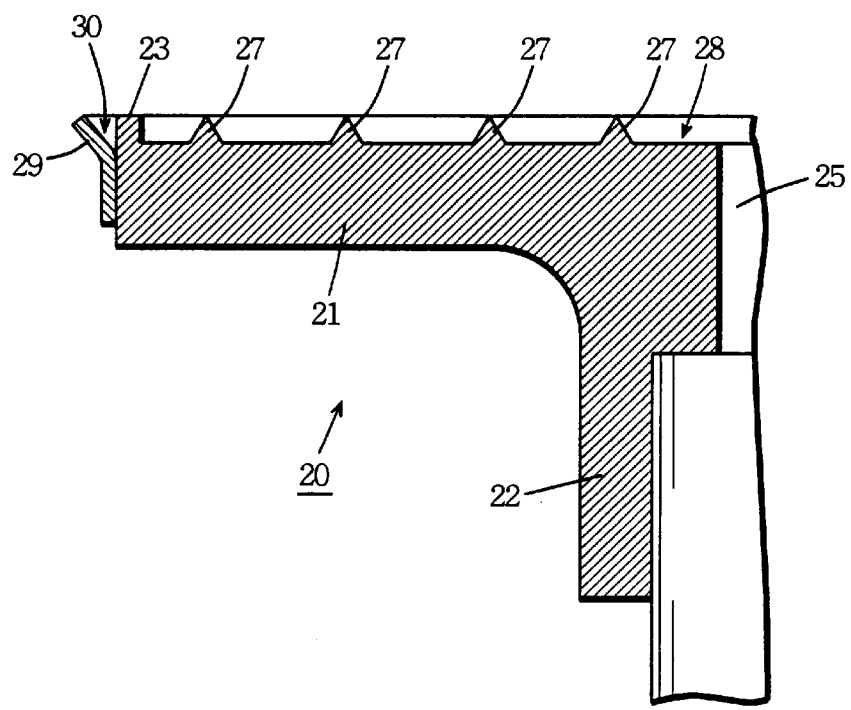
FIG. 5 is a sectional view showing part of a spin holder for a substrate processing apparatus according to a second embodiment of the present invention.

FIG. 5 is a sectional view showing part of a spin holder 20 for use in a substrate processing apparatus according to a second embodiment of the present invention.

As shown in FIG. 5, the circular wall portion 23 for supporting the back side of the substrate W is formed around the top surface of the disk-like supporting portion 21 of the spin holder 20. Further, a circular elastic member 29 is welded by vulcanization on the peripheral surface of the disk-like supporting portion 21, which surrounds the outside of the circular wall portion 23. This circular elastic member 29 is formed of fluororubber, e.g., perphloroestramer, which comes in close contact with the back side of the substrate W while spreading outward.

In this embodiment, the circular wall portion 23 corresponds to the first circular portion and the circular elastic member 29 corresponds to the second circular portion.

In other respects, the structure of the spin holder 20 of this embodiment is the same as that of the spin holder 20 shown in FIG. 2. The structure of the substrate processing apparatus of this embodiment is also the same as that of the substrate processing apparatus shown in FIG. 1 in other respects.

With the spin holder 20 of this embodiment, the top surface of the circular wall portion 23 on the disk-like supporting portion 21 supports the back side of the substrate W, and the circular elastic member 29 comes in close contact with the back side of the substrate W. Accordingly, even if a vacuum leakage occurs between the circular wall portion 23 and the back side of the substrate W due to suction force created by the vacuum suction source 12 of FIG. 1, the circular elastic member 29 keeps the hermetic state in the space 30 between the circular wall portion 23 and the circular elastic member 29.

This prevents mist around the spin holder 20 from being drawn to the suction surface between the circular elastic member 29 and the substrate W. As a result, it is possible to prevent adhesion of mist to the back side of the substrate W in the vicinity of the periphery of the spin holder 20, or to reduce the amount of adhering mist.

Figure 6:
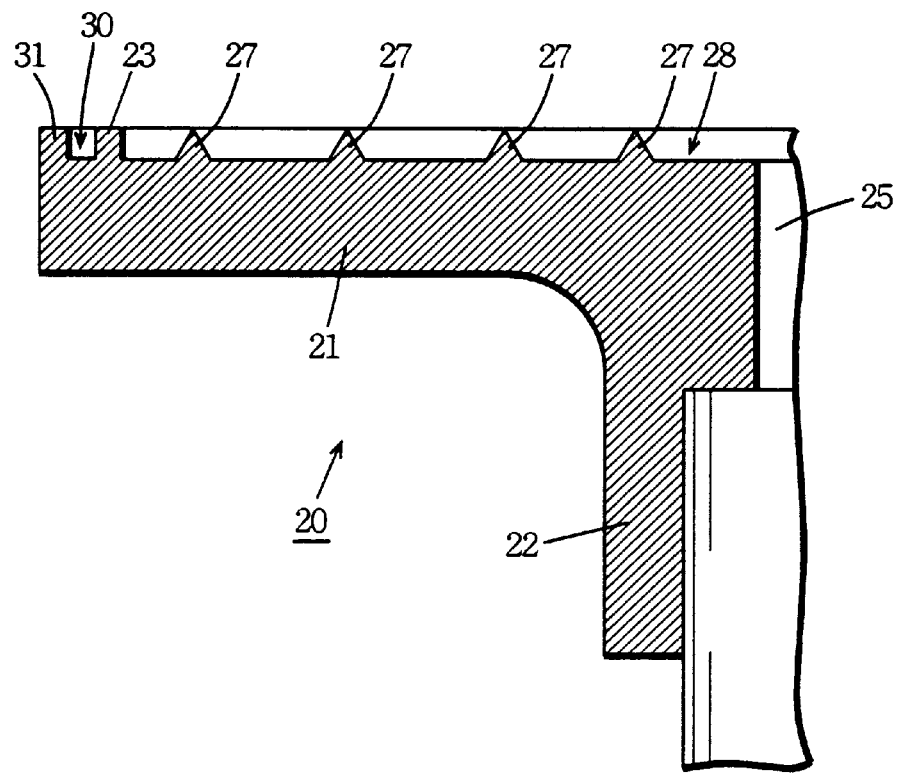
FIG. 6 is a sectional view showing part of a spin holder for a substrate processing apparatus according to a third embodiment of the present invention.

FIG. 6 is a sectional view showing part of a spin holder 20 for use in a substrate processing apparatus according to a third embodiment of the present invention.

As shown in FIG. 6, the circular wall portion 23 for supporting the back side of the substrate W is formed inside the periphery of the top surface of the disk-like supporting portion 21 of the spin holder 20. Further, a circular wall portion 31 is formed along the periphery of the top surface of the disk-like supporting portion 21, which surrounds the outside of the circular wall portion 23.

In other respects, the structure of the spin holder 20 of this embodiment is the same as that of the spin holder 20 shown in FIG. 2. The structure of the substrate processing apparatus of this embodiment is also the same as that of the substrate processing apparatus shown in FIG. 1 in other respects.

In this embodiment, the circular wall portion 23 corresponds to the first circular portion and the circular wall portion 31 corresponds to the second circular portion.

Figure 7:
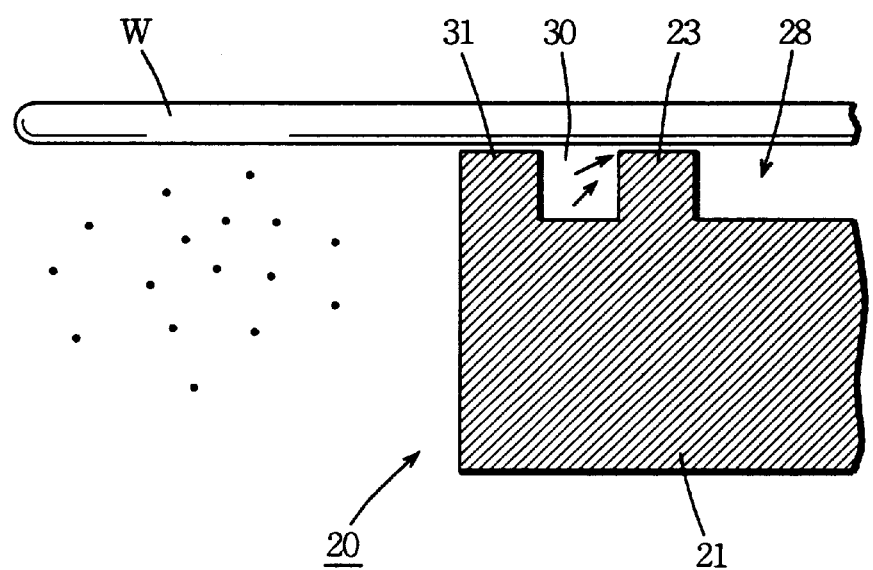
FIG. 7 is an enlarged section showing part of the spin holder shown in FIG. 6.

FIG. 7 is a sectional view showing part of the spin holder 20 shown in FIG. 6. As shown in FIG. 7, the top surface of the circular wall portion 23 and the top surface of the circular wall portion 31 on the disk-like supporting portion 21 support the back side of the substrate W. Accordingly, even if a vacuum leakage occurs between the circular wall portion 23 and the back side of the substrate W due to the suction force created by the vacuum suction source 12 of FIG. 1, the circular wall portion 31 keeps the space 30 between the circular wall portions 23 and 31 hermetically sealed.

This prevents mist around the spin holder 20 from being drawn to the suction surface between the circular wall portion 31 and the substrate W. As a result, it is possible to prevent adhesion of mist to the back side of the substrate W in the vicinity of the periphery of the spin holder 20, or to reduce the amount of adhering mist.

Figure 8:
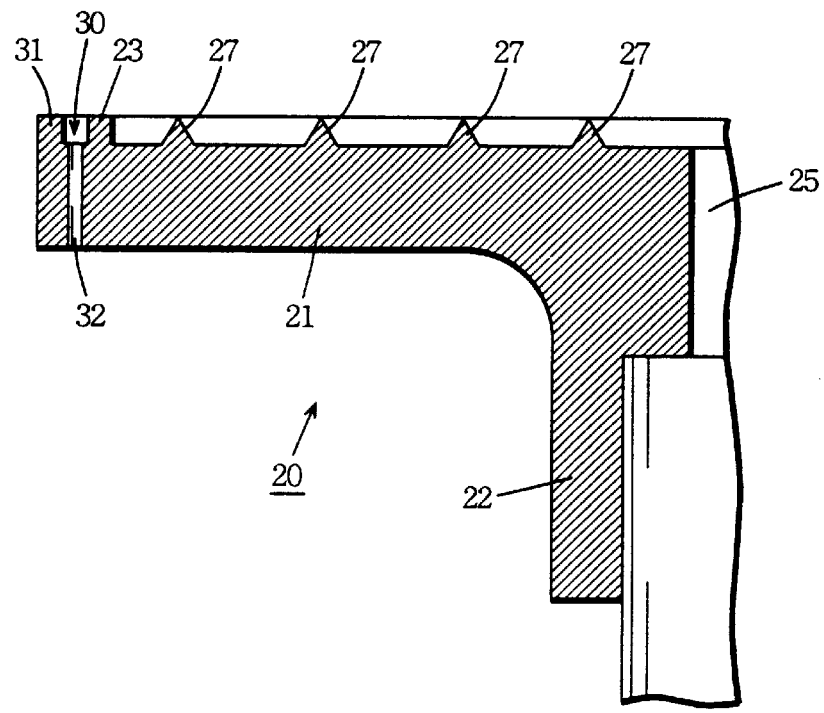
FIG. 8 is a sectional view showing part of a spin holder for a substrate processing apparatus according to a fourth embodiment of the present invention
Figure 9:
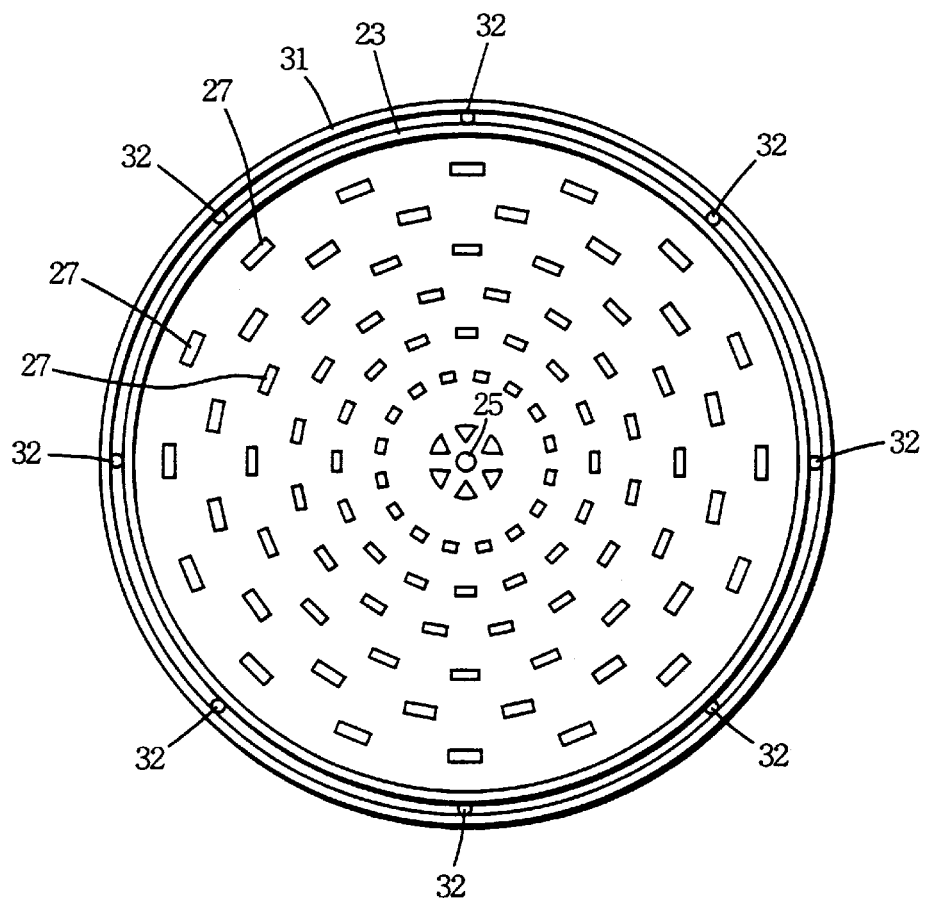
FIG. 9 is the plane view of the spin holder of FIG. 8.

FIG. 8 is a sectional view showing part of a spin holder 20 for use in a substrate processing apparatus according to a fourth embodiment of the present invention. FIG. 9 is the plane view showing the spin holder 20 of FIG. 8.

As shown in FIGS. 8 and 9, the circular wall portion 23 for supporting the back side of the substrate W is formed inside the periphery of the top surface of the disk-like supporting portion 21 of the spin holder 20, and the circular wall portion 31 is formed along the periphery of the top surface of the disk-like supporting portion 21, which surrounds the outside of the circular wall portion 23. Further, a plurality of connection holes 32 are formed to communicate with the space 30 between the circular wall portions 23 and 31 from the under surface of the disk-like supporting portion 21.

In other respects, the structure of the spin holder 20 of this embodiment is the same as that of the spin holder 20 shown in FIG. 2. The structure of the substrate processing apparatus of this embodiment is also the same as that of the substrate processing apparatus shown in FIG. 1 in other respects.

In this embodiment, the circular wall portion 23 corresponds to the first circular portion and the circular wall portion 31 corresponds to the second circular portion.

Figure 10:
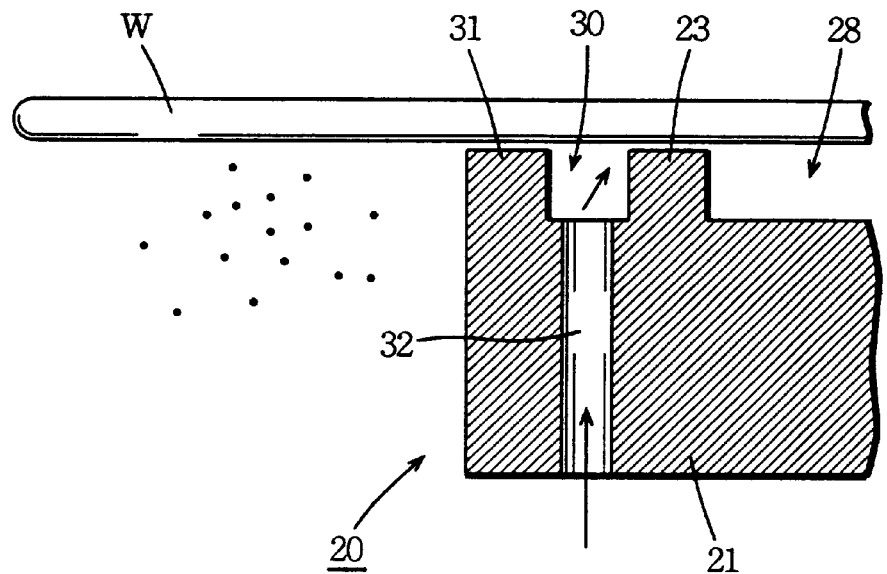
FIG. 10 is an enlarged section showing part of the spin holder of FIG. 8.

FIG. 10 is an enlarged sectional view showing part of the spin holder 20 shown in FIG. 8. As shown in FIG. 10, the top surface of the circular wall portion 23 on the disk-like supporting portion 21 and the top surface of the circular wall portion 31 support the back side of the substrate W. When a vacuum leakage occurs between the circular wall portion 23 and the back side of the substrate W due to the suction force created by the vacuum suction source 12 of FIG. 1, a flow of air is generated from under the spin holder 20 into the space 30 between the circular wall portions 23 and 31 through each connection hole 32, since the connection hole 32 passes from the under surface of the disk-like supporting portion 21 to its top surface. That is to say, the flow of air directed from around the spin holder 20 to the suction surface between the circular wall portion 31 and the substrate W is converted into flows of air directed from under the spin holder 20 into the connection holes 32. Then the mist around the spin holder 20 will not be drawn to the suction surface between the circular wall portion 31 and the substrate W.

A smaller amount of mist exists in the space under the spin holder 20 than in the space around the periphery of the spin holder 20. Hence, almost no mist will attach to the back side of the substrate W due to the flows of air guided into the space 30 between the circular wall portions 23 and 31 through the connection holes 32.

As a result, it is possible to prevent adhesion of mist to the back side of the substrate W in the vicinity of the periphery of the spin holder 20, or to reduce the amount of mist attached.

Figure 11:
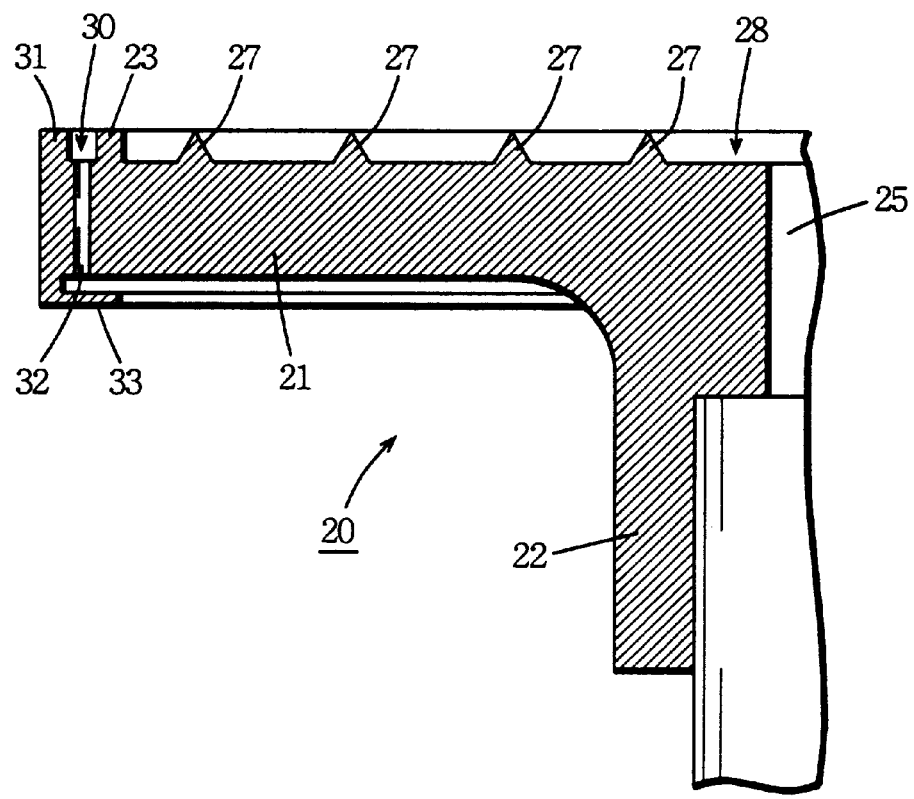
FIG. 11 is a sectional view showing part of a spin holder or a substrate processing apparatus according to a fifth embodiment of the present invention.

FIG. 11 is a sectional view showing part of a spin holder 20 for use in a substrate processing apparatus according to a fifth embodiment of the present invention.

As shown in FIG. 11, the circular wall portion 23 for supporting the back side of the substrate W is formed inside the periphery of the top surface of the disk-like supporting portion 21 of the spin holder 20, and the circular wall portion 31 is formed along the periphery of the top surface of the disk-like supporting portion 21, which surrounds the outside of the circular wall portion 23. Further, the plurality of connection holes 32 are formed to communicate with the space 30 between the circular wall portions 23 and 31 from the under side of the disk-like supporting portion 21.

Further, a circular shielding portion 33 is formed on the under side of the disk-like supporting portion 21. The circular shielding portion 33 extends down from the lower end of the periphery of the disk-like supporting portion 21 and horizontally bends inside. The circular shielding portion 33 shields the lower openings of the plurality of connection holes 32 at a given interval.

In other respects, the structure of the spin holder 20 of this embodiment is the same as that of the spin holder 20 shown in FIG. 8. The structure of the substrate processing apparatus of this embodiment is also the same as that of the substrate processing apparatus shown in FIG. 1 in other respects.

In this embodiment, the circular wall portion 23 corresponds to the first circular portion and the circular wall portion 31 corresponds to the second circular portion. The circular shielding portion 33 corresponds to a shielding portion.

Figure 12:
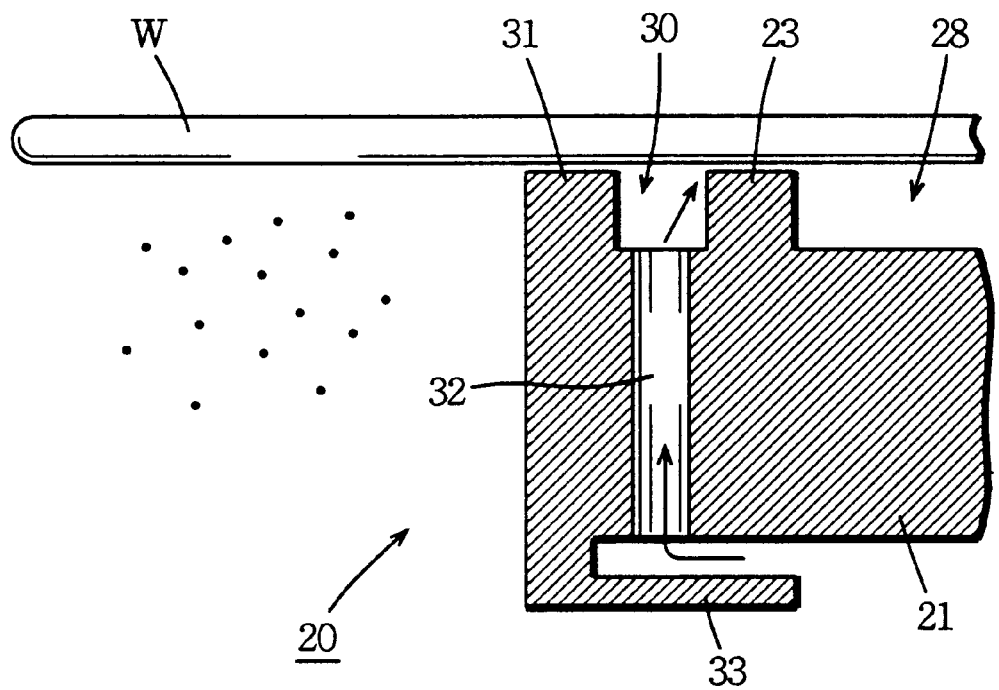
FIG. 12 is an enlarged section showing part of the spin holder of FIG. 11.

FIG. 12 is an enlarged sectional view showing part of the spin holder 20 shown in FIG. 11. As shown in FIG. 12, the top surface of the circular wall portion 23 and the top surface of the circular wall portion 31 on the disk-like supporting portion 21 support the back side of the substrate W. When a vacuum leakage occurs between the circular wall portion 23 and the back side of the substrate W due to the suction force from the vacuum suction source 12 of FIG. 1, a flow of air is generated from the central part of the under surface of the disk-like supporting portion 21 into the space 30 between the circular wall portions 23 and 31 through the gap between the circular shielding portion 33 and the disk-like supporting portion 21 and through the connection hole 32. That is to say, the flow of air directed from around the spin holder 20 to the suction surface between the circular wall portion 31 and the substrate W is converted into flows of air directed from around the central part under the spin holder 20 into the connection holes 32. This prevents mist around the spin holder 20 from being drawn to the suction surface between the circular wall portion 31 and the substrate W.

A smaller amount of mist exists in the space near the center under the spin holder 20 than in the space around the spin holder 20. Hence, almost no mist will attach to the back side of the substrate W due to the flows of air guided into the space 30 between the circular wall portions 23 and 31 through the connection holes 32.

As a result, it is possible to prevent adhesion of mist to the back side of the substrate W in the vicinity of the periphery of the spin holder 20, or to reduce the amount of adhering mist.

Figure 13A:
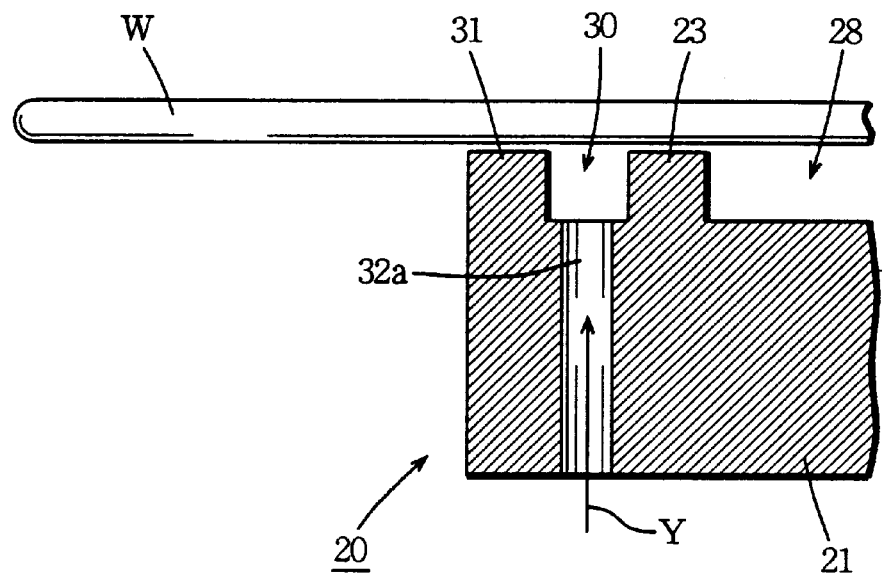
FIGS. 13a–c show an enlarged section, a plane view, and a side view of part of a spin holder for a substrate processing apparatus according to a sixth embodiment of the present invention.
Figure 13B:
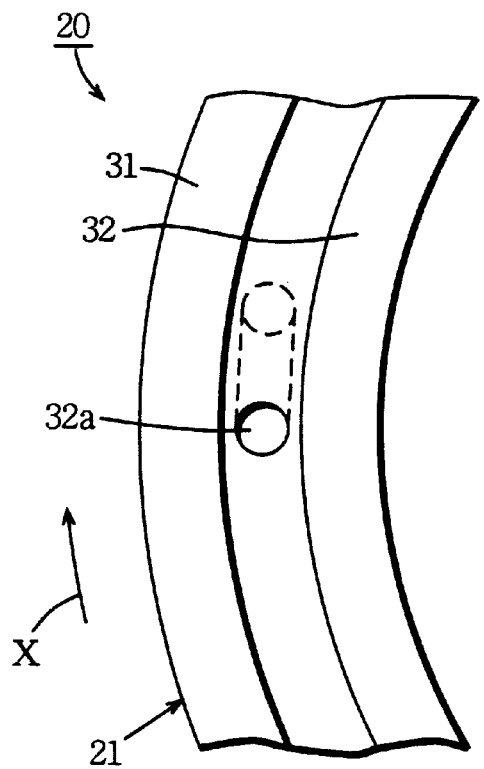
Figure 13C:
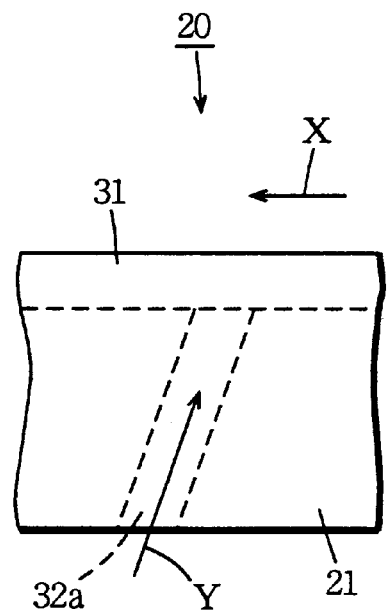

FIG. 13 shows part of a spin holder 20 for use in a substrate processing apparatus according to a sixth embodiment of the present invention, where (a) shows an enlarged section, (b) shows a plane view, and (c) shows a side view.

As shown in FIG. 13(a), the circular wall portion 23 for supporting the back side of the substrate W is formed inside the periphery of the top surface of the disk-like supporting portion 21 of the spin holder 20, and the circular wall portion 31 is formed along the periphery of the top surface of the disk-like supporting portion 21 to surround the outside of the circular wall portion 23. Further, as shown in FIG. 13(b), (c), a plurality of connection holes 32a are formed to communicate with the space 30 between the circular wall portions 23 and 31 from the back surface of the disk-like supporting portion 21, where the plurality of connection holes 32a are inclined in the circumferential direction.

In other respects, the structure of the spin holder 20 of this embodiment is the same as that of the spin holder 20 shown in FIG. 8. The structure of the substrate processing apparatus of this embodiment is also the same as that of the substrate processing apparatus shown in FIG. 1 in other respects.

In this embodiment, the circular wall portion 23 corresponds to the first circular portion and the circular wall portion 31 corresponds to the second circular portion.

As shown in FIG. 13(a), the top surface of the circular wall portion 23 and the top surface of the circular wall portion 31 on the disk-like supporting portion 21 support the back side of the substrate W. When the spin holder 20 rotates in the direction shown by the arrow X, an air flow is generated, as shown by the arrows Y, from the under side of the disk-like supporting portion 21 to the space 30 between the circular wall portions 23 and 31 through the connection hole 32a, since the plurality of connection holes 32a are inclined in the circumferential direction. This creates a positive pressure with respect to atmospheric pressure in the space 30 between the circular wall portions 23 and 31.

Hence, it is possible to sufficiently prevent mist around the spin holder 20 from being drawn to the suction surface between the circular wall portion 31 and the substrate W when a vacuum leakage occurs between the circular wall portion 23 and the back side of the substrate W due to the suction force created by the vacuum suction source 12 of FIG. 1.

A smaller amount of mist exists in the space under the spin holder 20 than in the peripheral space around the spin holder 20. Hence, almost no mist will attach to the back side of the substrate W due to the flows of air guided into the space 30 between the circular wall portions 23 and 31 through the connection holes 32a.

As a result, it is possible to prevent adhesion of mist to the back side of the substrate W in the vicinity of the periphery of the spin holder 20, or to reduce the amount of mist attached.

Figure 14:
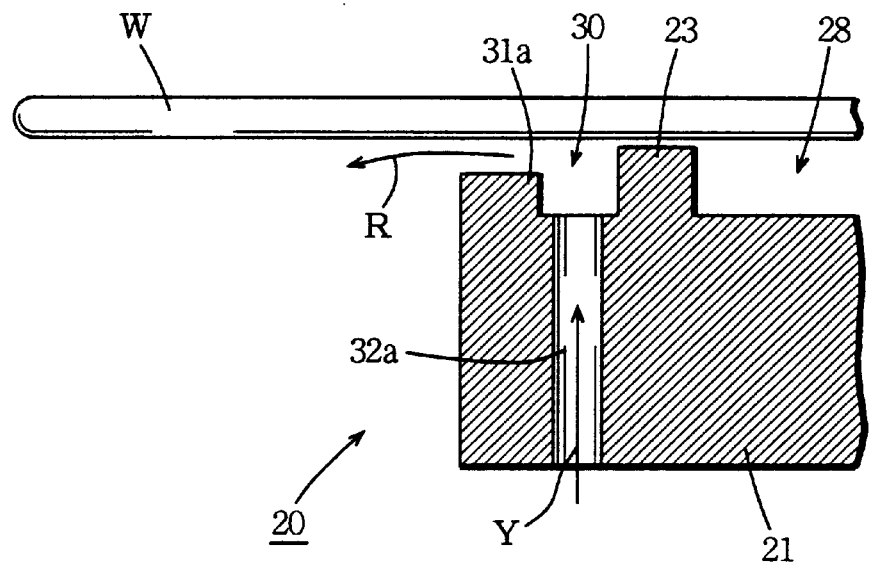
FIG. 14 is an enlarged section showing part of a spin holder for a substrate processing apparatus according to a seventh embodiment of the present invention.

FIG. 14 is an enlarged sectional view showing part of a spin holder 20 for use in a substrate processing apparatus according to a seventh embodiment of the present invention.

As shown in FIG. 14, the circular wall portion 23 for supporting the back side of the substrate W is formed inside the periphery of the top surface of the disk-like supporting portion 21 of the spin holder 20, and a circular wall portion 31a is formed to surround the outside of the circular wall portion 23 along the periphery of the top surface of the disk-like supporting portion 21, where the circular wall portion 31a is lower, in height, than the circular wall portion 23. Further, the plurality of connection holes 32a are formed to communicate with the space 30 between the circular wall portions 23 and 31a from the under side of the disk-like supporting member 21, where the plurality of connection holes 32a are inclined in the circumferential direction.

In other respects, the structure of the spin holder 20 of this embodiment is the same as that of the spin holder 20 shown in FIG. 13. The structure of the substrate processing apparatus of this embodiment is also the same as that of the substrate processing apparatus shown in FIG. 1 in other respects.

In this embodiment, the circular wall portion 23 corresponds to the first circular portion and the circular wall portion 31a corresponds to the second circular portion.

As shown in FIG. 14, the top surface of the circular wall portion 23 of the disk-like supporting portion 21 supports the back side of the substrate W. Since the circular wall portion 31a is lower than the circular wall portion 23, a gap is formed between the top surface of the circular wall portion 31a and the back side of the substrate W.

When the spin holder 20 rotates, an air flow is generated, similarly to the sixth embodiment, from the under side of the disk-like supporting portion 21 to the space 30 between the circular wall portions 23 and 31a through the connection hole 32a, as shown by the arrow Y. This creates a positive pressure with respect to atmospheric pressure in the space 30 between the circular wall portions 23 and 31a, and an air flow is generated as shown by the arrow R from the space 30 between the circular wall portions 23 and 31a to the outside of the spin holder 20.

Hence, it is possible to sufficiently prevent mist around the spin holder 20 from being drawn into the gap between the circular wall portion 31a and the substrate W when a vacuum leakage occurs between the circular wall portion 23 and the back side of the substrate W due to the suction force created by the vacuum suction source 12 of FIG. 1.

A smaller amount of mist exists in the space under the spin holder 20 than in the space surrounding the spin holder 20. Hence, almost no mist will attach to the back side of the substrate W due to the flows of air guided into the space 30 between the circular wall portions 23 and 31a through the connection holes 32a.

As a result, it is possible to prevent adhesion of mist to the back side of the substrate W in the vicinity of the periphery of the spin holder 20, or to reduce the amount of mist attached.

Figure 15:
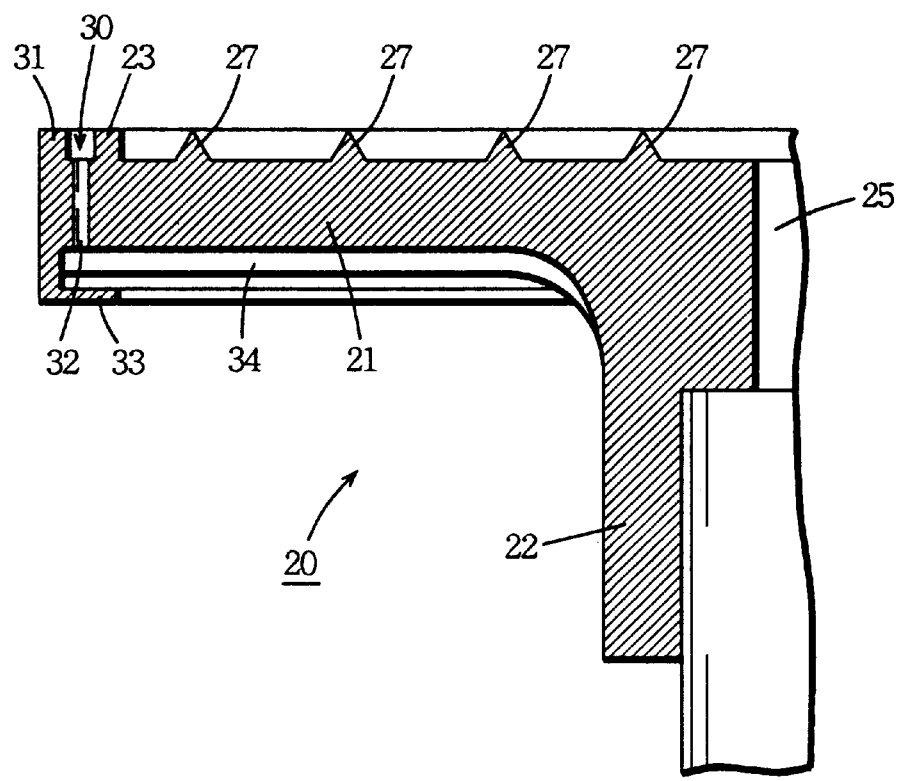
FIG. 15 is a sectional view showing part of a spin holder for a substrate processing apparatus according to an eighth embodiment of the present invention.
Figure 16:
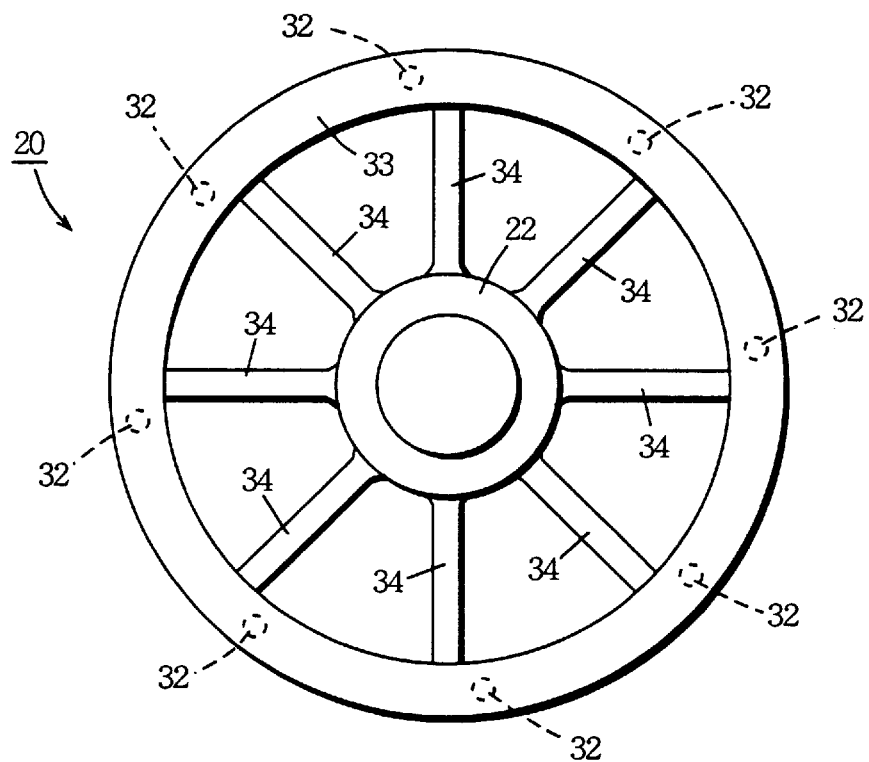
FIG. 16 is the bottom view showing the spin holder of FIG. 15.

FIG. 15 is a sectional view showing part of a spin holder 20 for use in a substrate processing apparatus according to an eighth embodiment of the present invention. FIG. 16 is the bottom view of the spin holder 20 of FIG. 15.

As shown in FIG. 15, the circular wall portion 23 for supporting the back side of the substrate W is formed inside the periphery of the top surface of the disk-like supporting portion 21 of the spin holder 20, and the circular wall portion 31 is formed along the periphery of the top surface of the disk-like supporting portion 21 to surround the outside of the circular wall portion 23. Further, the plurality of connection holes 32 are formed to communicate with the space 30 between the circular wall portions 23 and 31 from the under side of the disk-like supporting portion 21.

Further, similarly to the fifth embodiment, a circular shielding portion 33 is formed on the back side of the disk-like supporting portion 21. The circular shielding portion 33 extends down from the lower end of the periphery of the disk-like supporting portion 21 and horizontally bends inside. The circular shielding portion 33 shields the openings at the lower ends of the plurality of connection holes 32 at a given interval. The circular shielding portion 33 may be integrally formed with the disk-like supporting portion 21, or may be formed separately from the disk-like supporting portion 21.

Characteristically, in the spin holder 20 of this embodiment, a plurality of blades 34 are radially formed under the back surface of the disk-like supporting portion 21 to guide air flow into the connection holes 32 as the spin holder 20 rotates.

In other respects, the structure of the spin holder 20 of this embodiment is the same as that of the spin holder 20 shown in FIG. 11. The structure of the substrate processing apparatus of this embodiment is also the same as that of the substrate processing apparatus shown in FIG. 1 in other respects.

In this embodiment, the circular wall portion 23 corresponds to the first circular portion and the circular wall portion 31 corresponds to the second circular portion. The circular shielding portion 33 corresponds to the shielding portion.

In the spin holder 20 of this embodiment, the top surface of the circular wall portion 23 of the disk-like supporting portion 21 and the top surface of the circular wall portion 31 support the back side of the substrate W. When the spin holder 20 rotates, the plurality of blades 34 cause air flow directed from the back side of the disk-like supporting portion 21 into the space 30 between the circular wall portions 23 and 31 through the connection holes 32. This creates positive pressure with respect to atmospheric pressure in the space 30 between the circular wall portions 23 and 31. This sufficiently prevents mist around the spin holder 20 from being drawn to the suction surface between the circular wall portion 31 and the substrate W.

A smaller amount of mist exists in the space near the center under the spin holder 20 than in the space around the spin holder 20. Hence, almost no mist will attach to the back side of the substrate W due to the flow of air guided into the space 30 between the circular wall portions 23 and 31 through the connection holes 32.

As a result, it is possible to prevent adhesion of mist to the back side of the substrate W in the vicinity of the periphery of the spin holder 20, or to reduce the amount of adhering mist.

Figure 17:
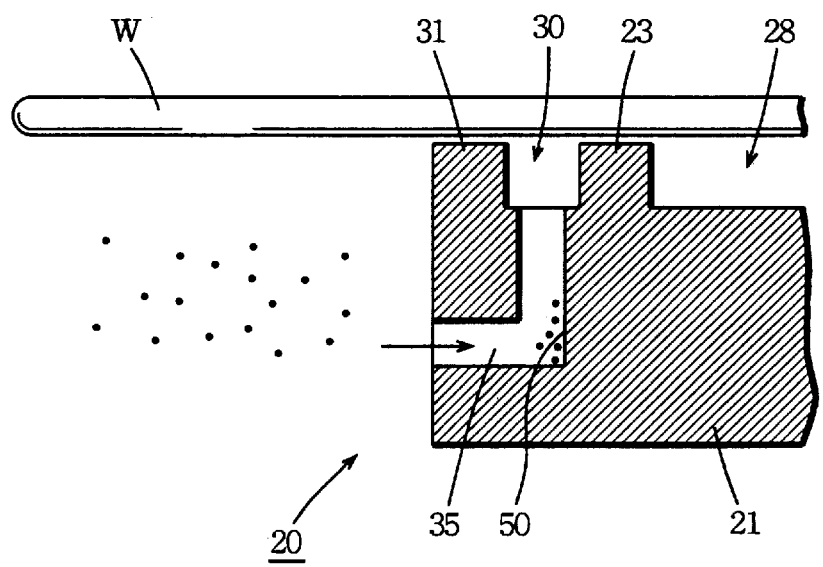
FIG. 17 is an enlarged section showing part of a spin holder for a substrate processing apparatus according to a ninth embodiment of the present invention.

FIG. 17 is an enlarged sectional view showing part of a spin holder 20 for use in a substrate processing apparatus according to a ninth embodiment of the present invention.

As shown in FIG. 17, the circular wall portion 23 for supporting the back side of the substrate W is formed inside the periphery of the top surface of the disk-like supporting portion 21 of the spin holder 20, and the circular wall portion 31 is formed along the periphery of the top surface of the disk-like supporting portion 21 to surround the outside of the circular wall portion 23. It also has a plurality of connection holes 35, which extend almost horizontally from the peripheral surface of the disk-like supporting portion 21 toward the center and bend in the vertical direction to open in the space 30 between the circular wall portions 23 and 31.

In other respects, the structure of the spin holder 20 of this embodiment is the same as that of the spin holder 20 of FIG. 8. The structure of the substrate processing apparatus of this embodiment is also the same as that of the substrate processing apparatus of FIG. 1.

In this embodiment, the circular wall portion 23 corresponds to the first circular portion and the circular wall portion 31 corresponds to the second circular portion.

In the spin holder 20 of this embodiment, the top surface of the circular wall portion 23 and the top surface of the circular wall portion 31 on the disk-like supporting portion 21 support the back side of the substrate W. When a vacuum leakage occurs between the circular wall portion 23 and the back side of the substrate W due to the suction force created by the vacuum suction source 12 of FIG. 1, an air flow is generated from the peripheral side of the disk-like supporting portion 21 to the space 30 between the circular wall portions 23 and 31 through the connection hole 35. This prevents mist around the spin holder 20 from being drawn to the suction surface between the circular wall portion 31 and the substrate W.

In this case, the mist introduced in to the connection holes 35 from the space around the disk-like supporting portion 21 attaches to the wall surface 50 in the connection holes 35. Hence almost no mist attaches to the back side of the substrate W due to the air flow guided into the space 30 between the circular wall portions 23 and 31 through the connection holes 32.

Thus it is possible to prevent adhesion of the mist to the back side of the substrate W in the vicinity of the periphery of the spin holder 20, or to reduce the amount of mist adhered.

Figure 18:
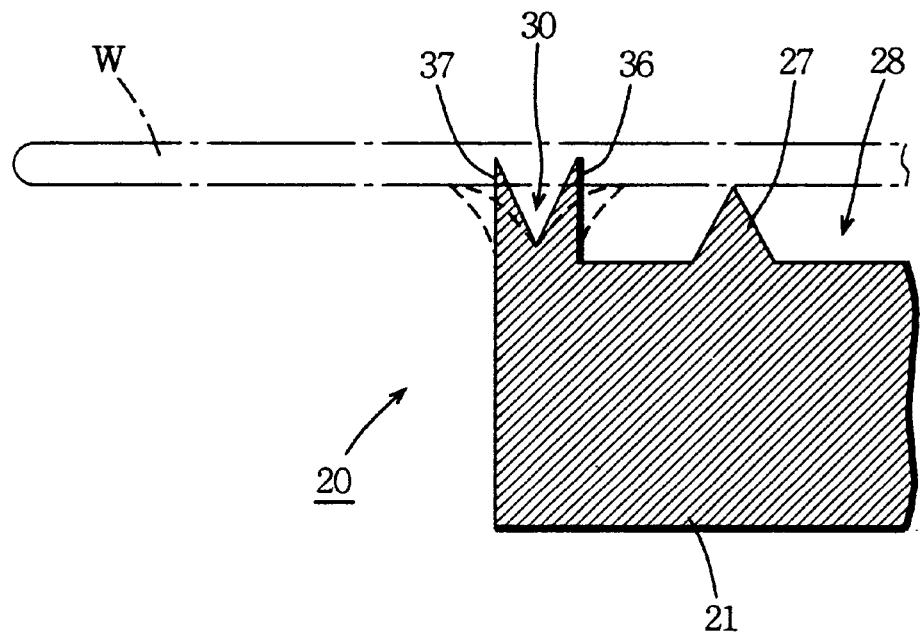
FIG. 18 is an enlarged section showing part of a spin holder for a substrate processing apparatus according to a tenth embodiment of the present invention.

FIG. 18 is an enlarged sectional view showing part of a spin holder 20 for use in a substrate processing apparatus according to a tenth embodiment of the present invention.

As shown in FIG. 18, two rows of circular elastic portions 36 and 37 each having a triangular section are provided along the periphery of the top surface of the disk-like supporting portion 21 of the spin holder 20. These circular elastic portions 36 and 37 are made elastic by processing the peripheral end of the disk-like supporting portion 21 thin.

In other respects, the structure of the spin holder 20 of this embodiment is the same as that of the spin holder 20 of FIG. 2. The structure of the substrate processing apparatus of this embodiment is also the same as that of the substrate processing apparatus of FIG. 1.

In this embodiment, the circular elastic portion 36 corresponds to the first circular portion and the circular elastic portion 37 corresponds to the second circular portion.

In the spin holder 20 of this embodiment, as shown by the broken lines, the circular elastic portion 36 comes in close contact with the back side of the substrate W while curving inward, and the circular elastic portion 37 comes in close contact with the back side of the substrate W while curving outward. In this case, the two rows of circular elastic portions 36 and 37 keep the vacuum state in the space 28 surrounded by the circular elastic portion 36, the disk-like supporting portion 21 and the substrate W.

Even if a vacuum leakage occurs between the circular elastic portion 36 and the back side of the substrate W due to the suction force created by the vacuum suction source 12 of FIG. 1, the circular elastic portion 37 keeps the hermetic state in the space 30 between the circular elastic portions 36 and 37. This prevents mist around the spin holder 20 from being drawn to the suction surface between the circular elastic portion 37 and the substrate W.

It is thus possible to prevent mist from attaching to the back side of the substrate W in the vicinity of the periphery of the spin holder 20, or to reduce the amount of mist attached.

Figure 19:
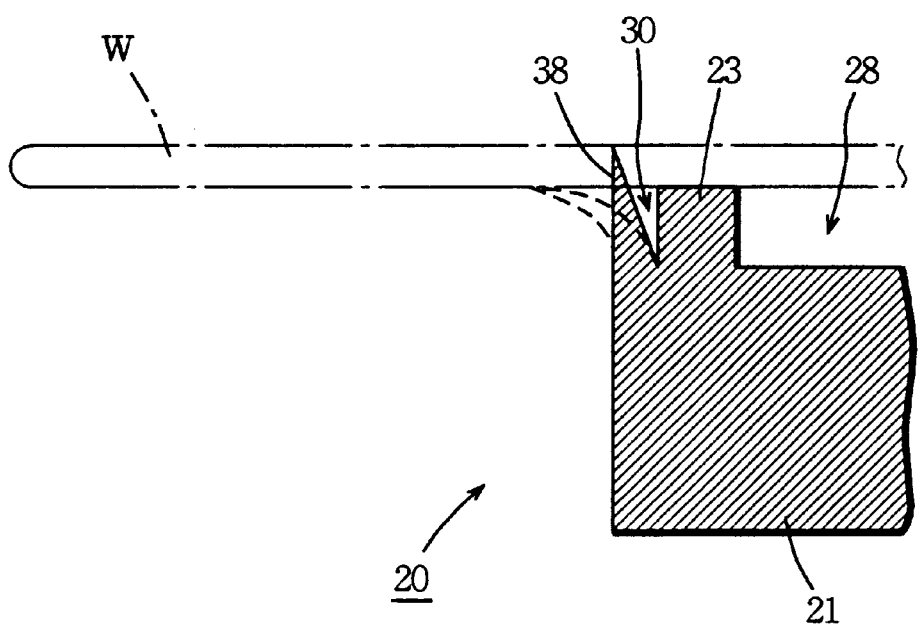
FIG. 19 is an enlarged section showing part of a spin holder for a substrate processing apparatus according to an eleventh embodiment of the present invention.

FIG. 19 is an enlarged sectional view showing part of a spin holder 20 for use in a substrate processing apparatus according to an eleventh embodiment of the present invention.

As shown in FIG. 19, the circular wall portion 23 for supporting the back side of the substrate W is formed inside the periphery of the top surface of the disk-like supporting portion 21 of the spin holder 20 and a circular elastic portion 38 having a triangular section is formed along the periphery of the top surface of the disk-like supporting portion 21 to surround the outside of the circular wall portion 23. Similarly to the circular elastic portions 36 and 37 shown in FIG. 18. this circular elastic portion 38 is formed to be elastic by processing the peripheral end of the disk-like supporting portion 21 thin.

In other respects, the structure of the spin holder 20 of this embodiment is the same as that of the spin holder 20 of FIG. 18. The structure of the substrate processing apparatus or this embodiment is also the same as that of the substrate processing apparatus of FIG. 1.

In this embodiment, the circular wall portion 23 corresponds to the first circular portion and the circular elastic portion 38 corresponds to the second circular portion.

In the spin holder 20 of this embodiment, the top surface of the circular wall portion 23 on the disk-like supporting portion 21 supports the back side of the substrate W and the circular elastic portion 38 comes in close contact with the back side of the substrate W while curving outside. Even if a vacuum leakage occurs between the circular wall portion 23 and the back side of the substrate W due to the suction force created by the vacuum suction source 12 of FIG. 1, the circular elastic portion 38 keeps the hermetic state in the space 30 between the circular wall portion 23 and the circular elastic portion 38.

This prevents mist around the spin holder 20 from being drawn to the suction surface between the circular elastic portion 37 and the back side of the substrate W. It is thus possible to prevent mist from attaching to the back side of the substrate W in the vicinity of the periphery of the spin holder 20, or to reduce the amount of mist attached.

Figure 20:
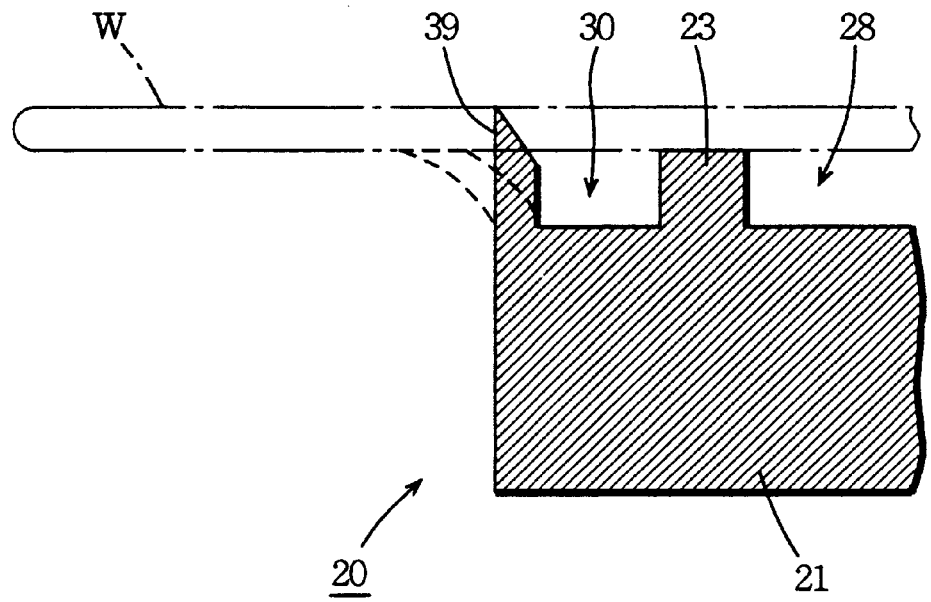
FIG. 20 is an enlarged section showing part of a spin holder for a substrate processing apparatus according to a twelfth embodiment of the present invention.

FIG. 20 is an enlarged sectional view showing part of a spin holder 20 for use in a substrate processing apparatus according to a twelfth embodiment of the present invention.

As shown in FIG. 20, the circular wall portion 23 for supporting the back side of the substrate W is formed inside the periphery of the top surface of the disk-like supporting portion 21 of the spin holder 20 and a circular elastic portion 39 is formed along the periphery of the top surface of the disk-like supporting portion 21 to surround the outside of the circular wall portion 23. Similarly to the circular elastic portions 36 and 37 in FIG. 18, this circular elastic portion 39 is formed elastic by processing the peripheral end of the disk-like supporting portion 21 thin.

In other respects, the structure of the spin holder 20 of this embodiment is the same as that of the spin holder 20 of FIG. 19. The structure of the substrate processing apparatus of this embodiment is also the same as that of the substrate processing apparatus of FIG. 1.

In this embodiment, the circular wall portion 23 corresponds to the first circular portion and the circular elastic portion 39 corresponds to the second circular portion.

In the spin holder 20 of this embodiment, the top surface of the circular wall portion 23 on the disk-like supporting portion 21 supports the back side of the substrate W and the circular elastic portion 39 comes in close contact with the back side of the substrate while curving outside. Even if a vacuum leakage occurs between the circular wall portion 23 and the backside of the substrate W due to the suction force created by the vacuum suction source 12 of FIG. 1, the circular elastic portion 39 keeps the hermetic state in the space 30 between the circular wall portion 23 and the circular elastic portion 39.

This prevents mist around the spin holder 20 from being drawn to the suction surface between the circular elastic portion 39 and the substrate W. It is thus possible to prevent mist from attaching to the back side of the substrate W in the vicinity of the periphery of the spin holder 20, or to reduce the amount of adhering mist.

Figure 21:
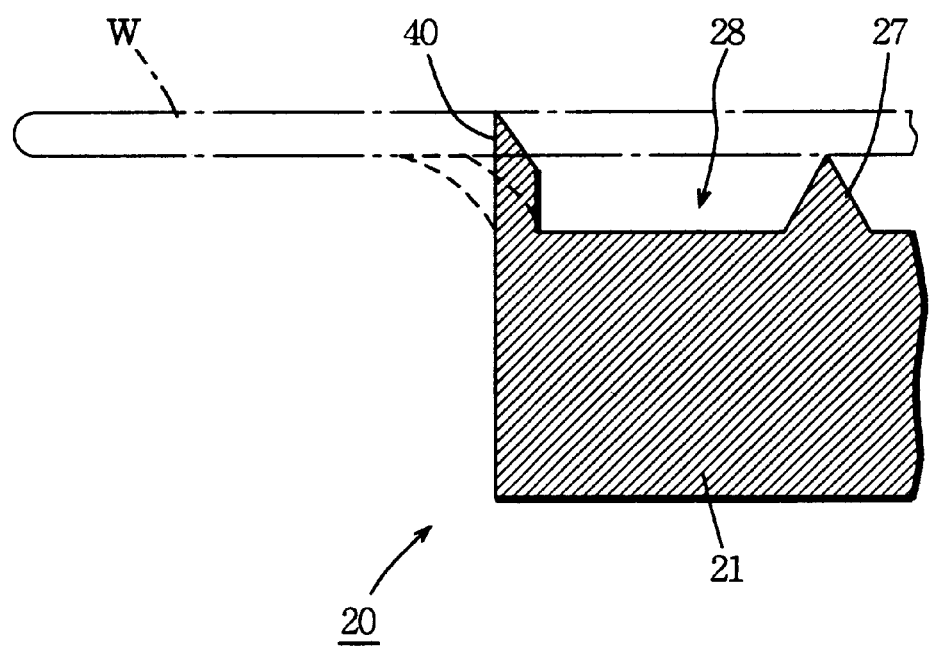
FIG. 21 is an enlarged section showing part of a spin holder for a substrate processing apparatus according to a thirteenth embodiment of the present invention.
Figure 22:
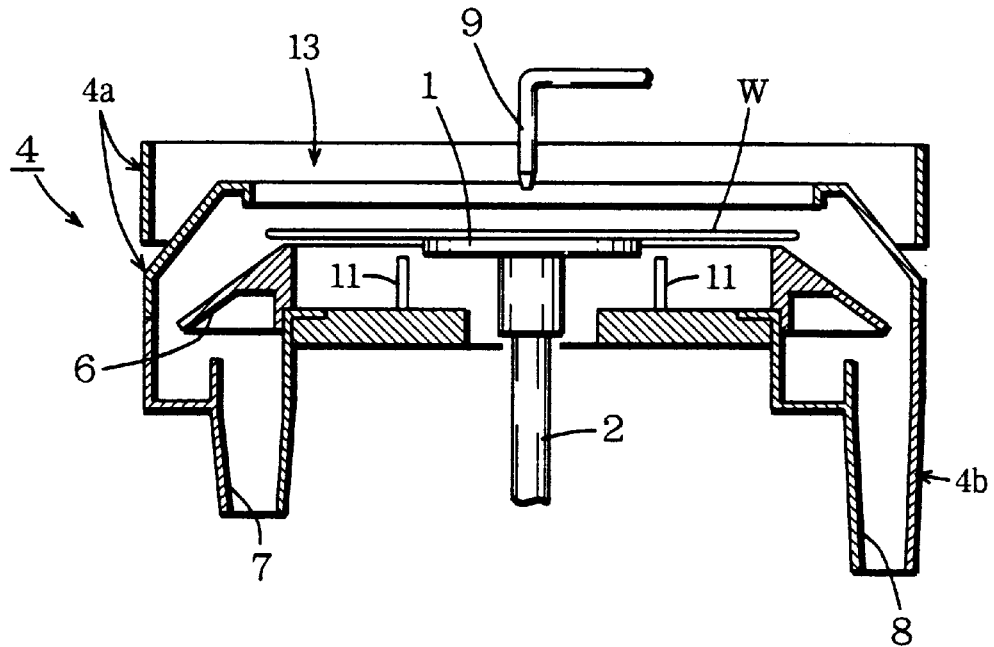
FIG. 22 is a schematic section showing the main part of a conventional substrate processing apparatus.
Figure 23:
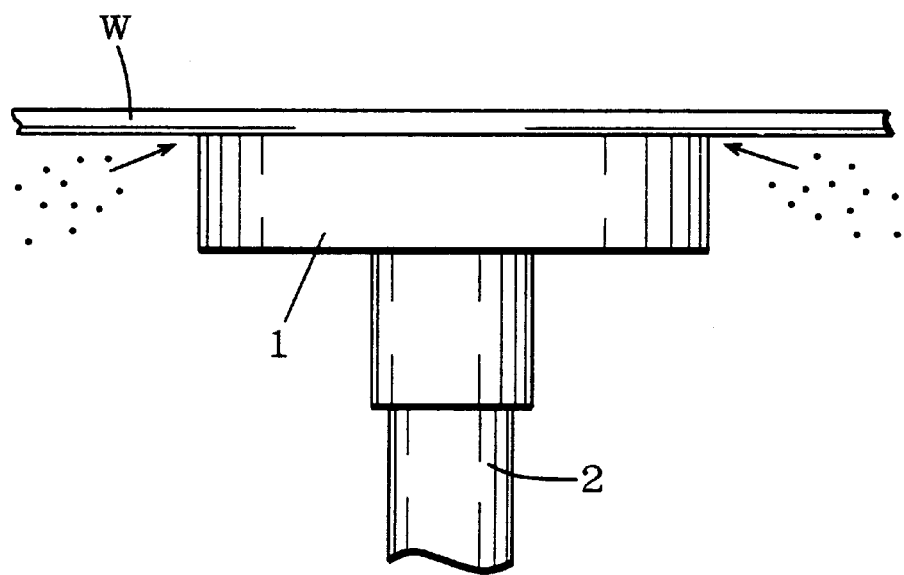
FIG. 23 is a diagram used to explain how mist is drawn toward the spin holder of the substrate processing apparatus shown in FIG. 22.

FIG. 21 is an enlarged sectional view showing part of a spin holder 20 for use in a substrate processing apparatus according to a thirteenth embodiment of the present invention.

As shown in FIG. 21, a circular elastic portion 40 is formed along the periphery of the top surface of the disk-like supporting portion 21 of the spin holder 20. Similarly to the circular elastic portions 36 and 37, this circular elastic portion 40 is formed to be elastic by processing the peripheral end of the disk-like supporting portion 21 thin.

In other respects, the structure of the spin holder 20 of this embodiment is the same as that of the spin holder 20 of FIG. 20. The structure of the substrate processing apparatus of this embodiment is also the same as that of the substrate processing apparatus of FIG. 1.

In the spin holder 20 of this embodiment, as shown by the broken line, the circular elastic portion 40 on the disk-like supporting portion 21 comes in close contact with the back side of the substrate W while curving outward to support the back side of the substrate W. In this case, the circular elastic portion 40 keeps the vacuum state in the space 28 surrounded by the circular elastic portion 40, the disk-like supporting portion 21, and the substrate W.

This prevents mist around the spin holder 20 from being drawn to the suction surface between the circular elastic portion 40 and the substrate W. It is thus possible to prevent mist from attaching to the back side of the substrate W in the vicinity of the periphery of the spin holder 20, or to reduce the amount of adhering mist.

Although a single second circular portion is formed in the above-described embodiments, a plurality of second circular portions may be provided.

The above-described embodiments have described applications of the present invention to spin coaters, but the present invention can be applied also to other spin substrate processing apparatuss, such as spin developers, spin cleaners, etc.

While the invention has been described in detail, the foregoing description is in all aspects illustrative and not restrictive. It is understood that numerous other modifications and variations can be devised without departing from the scope of the invention.

What is claimed is:

1. A substrate processing apparatus for applying given processing to a substrate while rotating the substrate, comprising:

a spin holder, having a first circular portion for supporting a back side of the substrate and at least one second circular portion provided to surround the outside of said first circular portion, for holding the substrate by suction in a horizontal attitude;

rotation driving means for rotating said spin holder; and suction means for sucking the substrate through a space inside said first circular portion on said spin holder, wherein said spin holder has one or a plurality of connection holes connecting a first space defined by said first circular portion, said second circular portion and the back side of the substrate and a second space outside said first space, and said one or plurality of connection holes regularly makes the atmosphere of said first space communicate with the atmosphere of said second space while the substrate is placed on said spin holder.

2. The substrate processing apparatus according to claim 1, wherein said second circular portion is a circular seal member provided on a top surface of said spin holder to come in close contact with the back side of the substrate.

3. The substrate processing apparatus according to claim 2, wherein said circular seal member is an O ring.

4. The substrate processing apparatus according to claim 1, wherein said second circular portion is a circular elastic member provided on a periphery of said spin holder to come in close contact with the back side of the substrate while spreading outward.

5. The substrate processing apparatus according to claim 4, wherein said circular elastic member is composed of a fluororesin.

6. The substrate processing apparatus according to claim 1, wherein said second circular portion is a circular wall portion provided on the outside of said first circular portion on a top surface of said spin holder.

7. The substrate processing apparatus according to claim 6, wherein said circular wall portion is composed of a synthetic resin.

8. The substrate processing apparatus according to claim 1, wherein said one or plurality of connection holes extend from an under surface of said spin holder to a top surface of said spin holder.

9. The substrate processing apparatus according to claim 8, wherein said spin holder has a shielding portion extending downward from the bottom end of a periphery of said spin holder, and covering the lower opening of said one or plurality of connection holes at an interval.

10. The substrate processing apparatus according to claim 1, wherein said one or plurality of connection holes extend from a peripheral surface of said spin holder and bend to a top surface of said spin holder.

11. The substrate processing apparatus according to claim 1, wherein said second circular portion is a circular elastic portion which comes in close contact with the back side of the substrate while curving outward.

12. The substrate processing apparatus according to claim 11, wherein said circular elastic portion has its thickness gradually thinned toward its top end.

13. The substrate processing apparatus according to claim 1, wherein said first circular portion is a circular elastic portion which comes in close contact with the back side of the substrate while curving inward.

14. The substrate processing apparatus according to claim 13, wherein said circular elastic portion has its thickness gradually thinned toward its top end.

15. A substrate processing apparatus for applying given processing to a substrate while rotating the substrate, comprising:
- a spin holder, having a first circular portion for supporting a back side of the substrate and at least one second circular portion provided to surround the outside of said first circular portion, for holding the substrate by suction in a horizontal attitude;
- one or a plurality of connection holes formed in said spin holder to connect a space between said first circular portion and said second circular portion to a space outside said spin holder, wherein said one or plurality of connection holes incline in a circumferential direction from the underside to the top of the spin holder;
- rotation driving means for rotating said spin holder;
- suction means for sucking the substrate through a space inside said first circular portion on said spin holder.

16. The substrate processing apparatus according to claim 15, wherein a gap is formed between said second circular portion and the back side of said substrate.

17. A substrate processing apparatus for applying given processing to a substrate while rotating the substrate, comprising:
- a spin holder, having a first circular portion for supporting a back side of the substrate and at least one second circular portion provided to surround the outside of said first circular portion, for holding the substrate by suction in a horizontal attitude;
- one or a plurality of connection holes formed in said spin holder to connect a space between said first circular portion and said second circular portion to a space outside said spin holder, wherein said one or a plurality of connection holes extend from the underside to the top of the spin holder;
- one or a plurality of blades provided on the under surface of said spin holder to guide an air flow in said one or a plurality of connection holes as said spin holder rotates;
- rotation driving means for rotating said spin holder;
- suction means for sucking the substrate through a space inside said first circular portion on said spin holder.

* * * * *